United States Patent
Koishi

(10) Patent No.: US 10,582,102 B2
(45) Date of Patent: Mar. 3, 2020

(54) IMAGING APPARATUS, ON-VEHICLE CAMERA, AND IMAGE PROCESSING METHOD

(71) Applicant: KYOCERA Corporation, Kyoto (JP)

(72) Inventor: Tomofumi Koishi, Tochigi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/084,324

(22) PCT Filed: Mar. 15, 2017

(86) PCT No.: PCT/JP2017/010505
§ 371 (c)(1),
(2) Date: Sep. 12, 2018

(87) PCT Pub. No.: WO2017/169805
PCT Pub. Date: Oct. 5, 2017

(65) Prior Publication Data
US 2019/0075226 A1    Mar. 7, 2019

(30) Foreign Application Priority Data
Mar. 29, 2016    (JP) .................... 2016-065945

(51) Int. Cl.
| | |
|---|---|
| *H04N 5/225* | (2006.01) |
| *H04N 9/07* | (2006.01) |
| *H04N 5/369* | (2011.01) |
| *H04N 5/335* | (2011.01) |
| *H04N 9/73* | (2006.01) |
| *H01L 27/146* | (2006.01) |

(52) U.S. Cl.
CPC ........... *H04N 5/2254* (2013.01); *H04N 5/335* (2013.01); *H04N 5/369* (2013.01); *H04N 9/07* (2013.01); *H04N 9/735* (2013.01); *H01L 27/14621* (2013.01); *H01L 27/14623* (2013.01)

(58) Field of Classification Search
CPC ...... H04N 5/2254; H04N 5/335; H04N 5/369; H04N 9/07; H04N 9/735; H01L 27/14621; H01L 27/14623
See application file for complete search history.

(56) References Cited

U.S. PATENT DOCUMENTS

| | | | |
|---|---|---|---|
| 2002/0048093 A1* | 4/2002 | Suzuki | G02B 13/04 359/752 |
| 2003/0071271 A1 | 4/2003 | Suzuki et al. | |
| 2007/0258710 A1* | 11/2007 | Yamasaki | G03B 13/34 396/121 |
| 2009/0242735 A1 | 10/2009 | Masuyama et al. | |
| 2012/0154596 A1 | 6/2012 | Wajs | |
| 2017/0140221 A1* | 5/2017 | Ollila | G06K 9/00604 |

FOREIGN PATENT DOCUMENTS

| | | |
|---|---|---|
| JP | S63-036767 Y2 | 9/1988 |
| JP | 2001-160973 A | 6/2001 |
| JP | 2006-173314 A | 6/2006 |

* cited by examiner

*Primary Examiner* — Antoinette T Spinks
(74) *Attorney, Agent, or Firm* — Studebaker & Brackett PC

(57) ABSTRACT

An imaging apparatus includes a lens, a mask, and an image sensor. The mask includes a first aperture and a second aperture on which light passing through the lens is incident. The image sensor performs photoelectric conversion on first light that passes through the first aperture and second light that passes through the second aperture, the first light and the second light being irradiated on an optical detection surface of the image sensor.

11 Claims, 7 Drawing Sheets

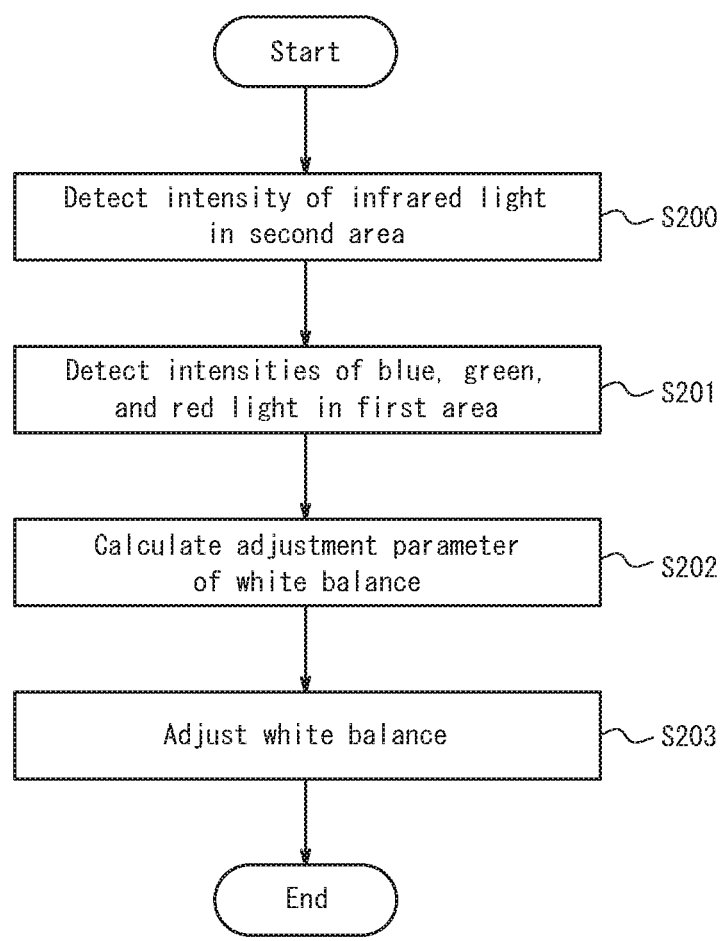

IMAGING APPARATUS, ON-VEHICLE CAMERA, AND IMAGE PROCESSING METHOD

CROSS-REFERENCE TO RELATED APPLICATION

The present application claims priority to and the benefit of Japanese Patent Application No. 2016-065945 filed Mar. 29, 2016, the entire contents of which are incorporated herein by reference.

TECHNICAL FIELD

The present disclosure relates to an imaging apparatus, an on-vehicle camera, and an image processing method.

BACKGROUND

Techniques exist for adjusting the white balance of captured images in imaging apparatuses, such as cameras. For example, an imaging apparatus includes photodiodes, one with a red transmission filter and one with a blue transmission filter, inside the image circle of the lens and outside of the effective imaging area of the image sensor. The imaging apparatus adjusts the white balance on the basis of the output of the photodiodes.

SUMMARY

An imaging apparatus according to an embodiment of the present disclosure includes a lens, a mask, and an image sensor. The mask includes a first aperture and a second aperture on which light passing through the lens is incident. The image sensor performs photoelectric conversion on first light that passes through the first aperture and on second light that passes through the second aperture, the first light and the second light being irradiated on an optical detection surface of the image sensor.

An on-vehicle camera according to an embodiment of the present disclosure includes a lens, a mask, and an image sensor. The mask includes a first aperture and a second aperture on which light passing through the lens is incident. The image sensor performs photoelectric conversion on first light that passes through the first aperture and on second light that passes through the second aperture, the first light and the second light being irradiated on an optical detection surface of the image sensor.

An image processing method according to an embodiment of the present disclosure uses an imaging apparatus that includes a lens, a mask, an image sensor, and a processor. The mask includes a first aperture and a second aperture on which light passing through the lens is incident. The image sensor performs photoelectric conversion on first light that passes through the first aperture and on second light that passes through the second aperture, the first light and the second light being irradiated on an optical detection surface of the image sensor. The image processing method includes calculating, using the processor, an intensity of the second light and adjusting a white balance, using the processor, on the basis of the calculated intensity.

BRIEF DESCRIPTION OF THE DRAWINGS

In the accompanying drawings:

FIG. 9 is a flowchart illustrating operations of an imaging apparatus according to a modification to an embodiment.

DETAILED DESCRIPTION

Embodiments of the present disclosure are described below with reference to the drawings.

Figure 1:
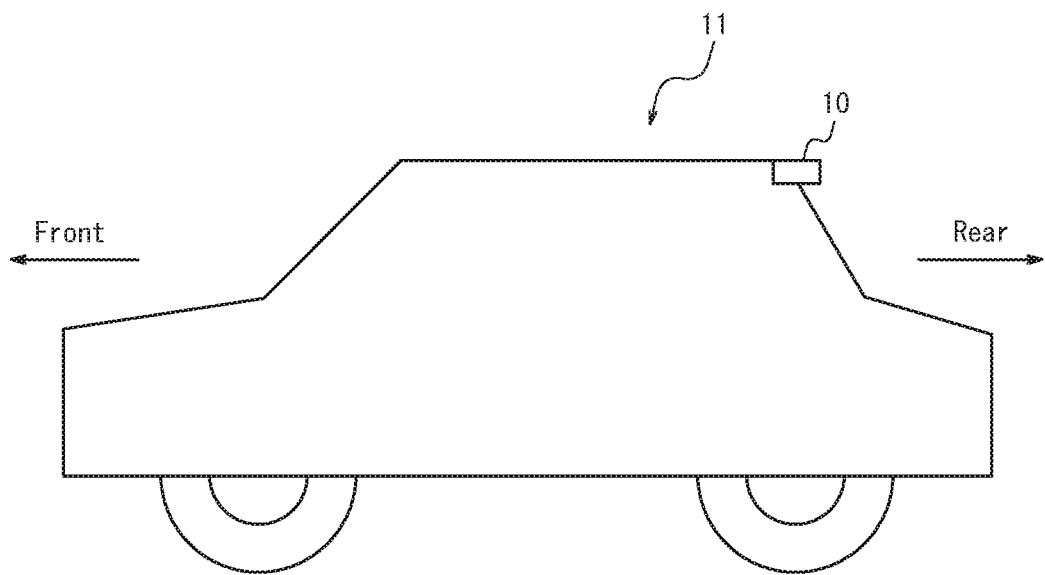
FIG. 1 illustrates a vehicle including an imaging apparatus according to an embodiment of the present disclosure.

With reference to FIG. 1, a vehicle 11 that includes an imaging apparatus 10 according to an embodiment of the present disclosure is described below.

The imaging apparatus 10 is used as an on-vehicle camera, for example. The imaging apparatus 10 is installed in the vehicle 11. Examples of the vehicle 11 include an automobile. The vehicle 11 runs in response to operation by the driver of the vehicle 11. In the present embodiment, the imaging apparatus 10 is installed in the rear of the vehicle 11, for example, to allow an image of an outside area at the rear of the vehicle 11 to be captured. The number and arrangement of imaging apparatuses 10 in the vehicle 11 may be chosen freely.

The imaging apparatus 10 according to the present embodiment includes an imaging optical system and an image sensor, as described below. A plurality of RGB pixels are arrayed on the optical detection surface of the image sensor, for example in a pattern such as a Bayer array. The optical detection surface of the image sensor is also referred to below as the effective imaging area of the image sensor. For example, a color filter corresponding to one of the colors RGB is provided on each pixel. The pixels corresponding to R, G, and B are also referred to below as pixel R, pixel G, and pixel B. The light passing through the imaging optical system is irradiated onto the optical detection surface of the image sensor.

The imaging apparatus 10 according to the present embodiment executes white balance processing on the basis of a comparison between the intensity of light in the infrared band and the intensity of light in another wavelength band among the light passing through the imaging optical system. The light in another wavelength band may, for example, include red light, green light, and blue light. Details are provided below.

Figure 2:
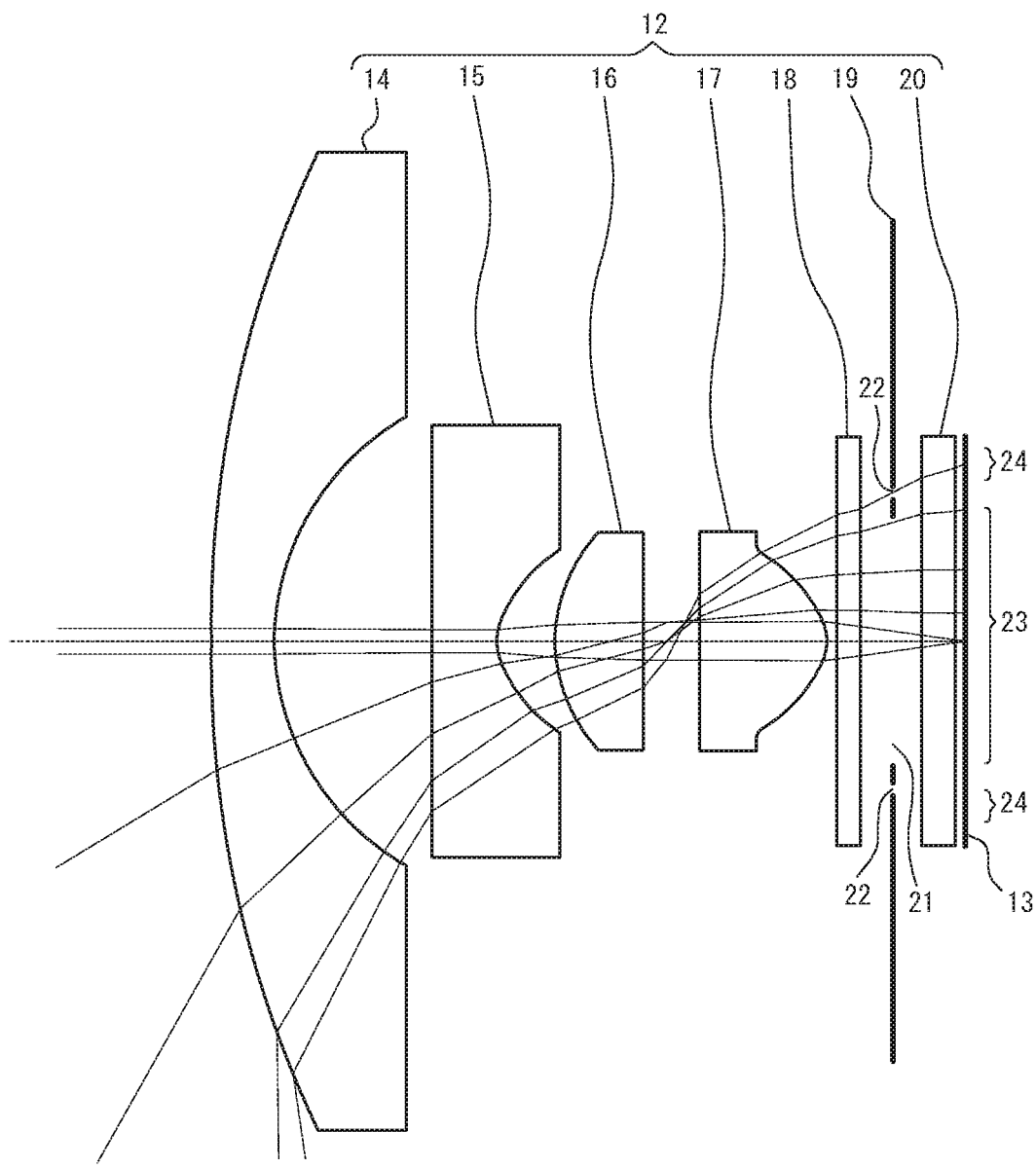
FIG. 2 illustrates the schematic configuration of an imaging optical system and an image sensor of the imaging apparatus.

With reference to FIG. 2, the configurations of the imaging optical system 12 and the image sensor 13 included in the imaging apparatus 10 are described. FIG. 2 omits components other than the imaging optical system 12 and the image sensor 13. For example, these components include a housing of the imaging apparatus 10, a lens barrel for holding the imaging optical system 12, and the like.

The imaging optical system 12 includes a plurality of optical members. For example, in the imaging optical system 12 illustrated in FIG. 2, four lenses 14 to 17, a filter 18, a mask 19, and a cover glass 20 for protecting the image sensor 13 are arranged in a line from the object side to the image side. The lenses 14 to 17, the filter 18, and the mask 19 are each shaped as a disk centered on the optical axis. The number and positional relationships of lenses, filters, and masks are not limited to the above-described configuration and may be selected freely.

The imaging optical system 12 that includes the four lenses 14 to 17 is, for example, configured as a fisheye lens with a field of view of 180° or more. For example, the lens 14 positioned furthest on the object side has a chromatic aberration that increases radially outward from the optical axis.

The filter 18 functions as a dual bandpass filter, for example. Specifically, the filter 18 transmits light in two predetermined wavelength bands and reduces or shields light in another wavelength band.

Figure 3:
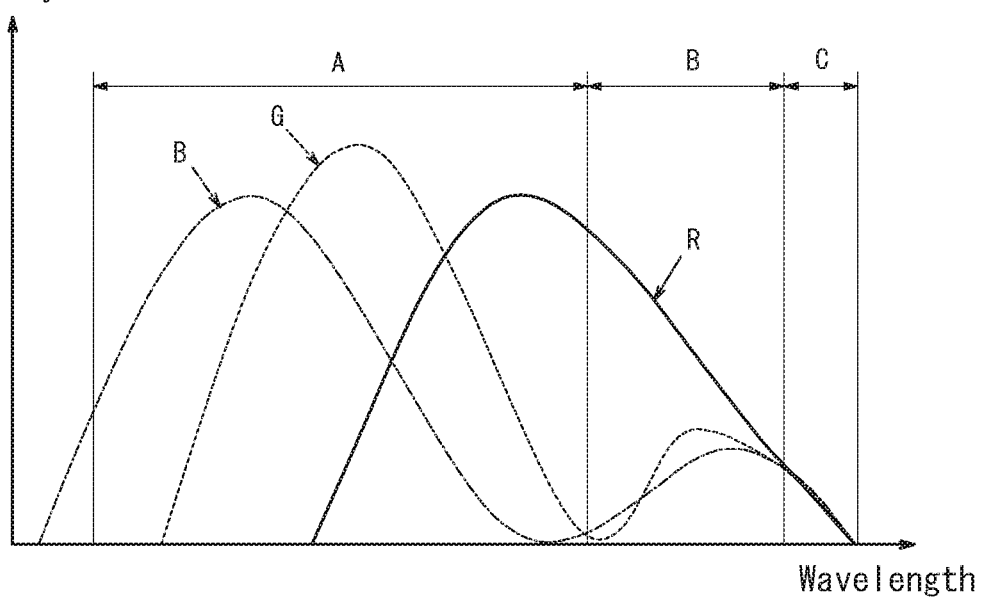
FIG. 3 is a graph in which the horizontal axis represents the wavelength of light and the vertical axis represents the sensitivity of RGB pixels.

The two wavelength bands in which the filter 18 transmits light are described with reference to FIG. 3. As illustrated in FIG. 3, for example, the relationship between the wavelength of light and sensitivity of a pixel can be determined in advance by experiment or simulation. The sensitivity of pixels in the image sensor 13 with respect to light irradiated on the optical detection surface differs among pixel R, pixel G, and pixel B, as illustrated in FIG. 3.

For example, the sensitivity of pixels with respect to light of any wavelength in a visible light band A differs among pixel R, pixel G, and pixel B. The filter 18 according to the present embodiment transmits light in the visible light band A.

The sensitivity of pixels with respect to light of any wavelength in a first infrared band B with a longer wavelength than the visible light band A differs among pixel R, pixel G, and pixel B. For example, the sensitivity of pixel R with respect to light of any wavelength in the first infrared band B is greater than the sensitivity of pixel G and pixel B, as illustrated in FIG. 3. Consequently, when light of any wavelength in the first infrared band B is irradiated on the optical detection surface of the image sensor 13, for example, the signal intensity is greater for pixel R than for pixel G or pixel B. This may adversely affect the white balance, for example by yielding a reddened captured image. The filter 18 according to the present embodiment reduces or blocks light in the first infrared band B.

On the other hand, the sensitivity of pixels with respect to any wavelength in a second infrared band C, which has an even longer wavelength than the first infrared band, differs little between RGB pixels as compared to the visible light band A and the first infrared band B, even if the sensitivities of pixel R, pixel G, and pixel B do not strictly coincide. The sensitivities of pixel R, pixel G, and pixel B relative to any wavelength in the second infrared band C can therefore be considered substantially equal. Consequently, the RGB signal intensities exhibit a substantially uniform increase upon an increase in the intensity of light that has a wavelength in the second infrared band C and is irradiated on the optical detection surface of the image sensor 13. The filter 18 according to the present embodiment transmits light in the second infrared band C. Light in the second infrared band C is also referred to below as infrared light.

As described above, the filter 18 according to the present embodiment transmits light in two wavelength bands, i.e. the visible light band A and the second infrared band C, and reduces or blocks light in another wavelength band. The other wavelength band includes the first infrared band B, for example. Light in the visible light band A is transmitted by the filter 18. Consequently, the imaging apparatus 10 can generate a color image. Light in the second infrared band C is transmitted by the filter 18. Hence, the RGB signal intensities exhibit a substantially uniform increase even when the intensity of light in the visible light band A is small relative to the intensity of light in the second infrared band C, for example at night. This configuration can therefore suppress the adverse effect on white balance while allowing generation of a relatively bright color image. Conversely, light in the first infrared band B is reduced or blocked by the filter 18. This suppresses the adverse effect on white balance, such as an increase only in the signal intensity of the pixel R, when the intensity of light in the first infrared band B is relatively large.

For example, when the intensity of light in the second infrared band C is greater than the intensity of light in the visible light band A by at least a certain degree, the saturation of the captured image may decrease due to the effect of light in the second infrared band C. An appropriate white balance might therefore not be achieved. For example, the entire captured image may be whitish or pale in color. By contrast, the imaging apparatus 10 according to the present embodiment executes white balance processing on the basis of a comparison between the intensity of light in the second infrared band C and the intensity of light in another wavelength band, as described below. The light in another wavelength band may, for example, include red light, green light, and blue light. This configuration suppresses the adverse effect on the white balance under imaging conditions such as the intensity of light in the second infrared band C being greater than the intensity of light in the visible light band A by at least a certain degree.

The mask 19 illustrated in FIG. 2 blocks a portion of light passing through the lenses 14 to 17. In the present embodiment, the mask 19 includes one first aperture 21 and one or more second apertures 22. Among the light passing through the lenses 14 to 17, the mask 19 transmits only light incident on the first aperture 21 and the second aperture 22 to the image side beyond the mask 19 and blocks other light. The area, on the optical detection surface of the image sensor 13, on which light passing through the first aperture 21 is irradiated is referred to below as a first area 23. The light passing through the first aperture 21 is also referred to as first light. The area, on the optical detection surface of the image sensor 13, on which light passing through the second aperture 22 is irradiated is referred to below as a second area 24. The light passing through the second aperture 22 is also referred to as second light.

Figure 4:
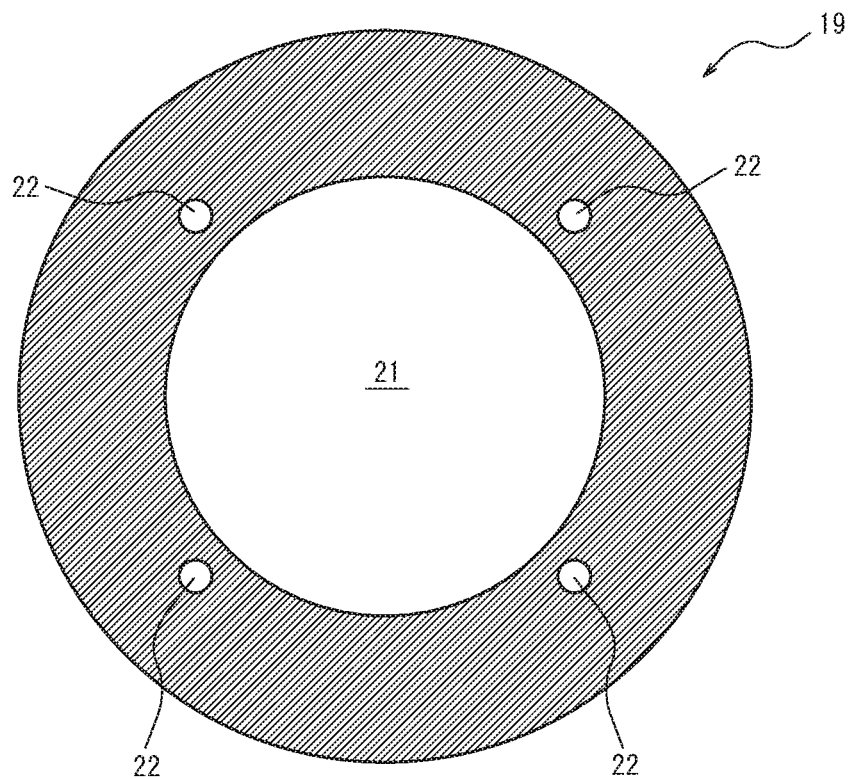
FIG. 4 is a front view of a mask included in the imaging optical system.
Figure 5:
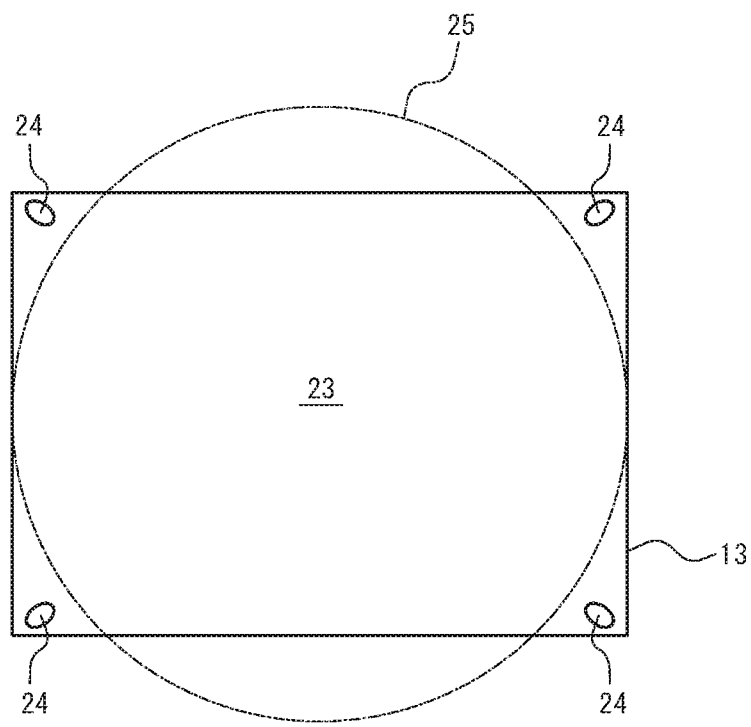
FIG. 5 illustrates the positional relationship between the optical detection surface of the image sensor and the irradiation region of light passing through the mask.

The first aperture 21 is, for example, a substantially circular hole as illustrated in FIG. 4. The first aperture 21 defines an image circle of light passing through the imaging optical system 12. In the present embodiment, the first aperture 21 is arranged so that the diameter of the image circle 25 substantially matches the length in the longitudinal direction of the optical detection surface of the image sensor 13 and so that the center of the image circle 25 is positioned at the center of the optical detection surface of the image sensor 13, for example as illustrated in FIG. 5. The four corners of the optical detection surface are therefore located outside of the image circle 25. The size of the image circle 25 and the position thereof relative to the optical detection surface are not limited to the above-described example. It suffices for at least a portion of the optical detection surface to be located outside of the image circle 25.

The second aperture 22 is, for example, a hole with a smaller aperture area than that of the first aperture 21, as illustrated in FIG. 4. The second aperture 22 may, for example, be a pinhole. As viewed from the center of the first aperture 21, the second aperture 22 is located radially outward from the first aperture 21. The first area 23 irradiated by the first light that passes through the first aperture 21 and the second area 24 irradiated by the second light that passes through the second aperture 22 are separate from each other, for example as illustrated in FIG. 5. Specifically, the second area 24 is positioned outside of the image circle 25 on the optical detection surface. The second area 24 may be positioned in any one of the four corners of the optical detection surface, for example.

The second light that passes through the second aperture 22 is now described in detail. As illustrated in FIG. 2, a portion of the light that is incident on the peripheral portion of the lens surface on the object side of the lens 14, for example, passes through the second aperture 22 of the mask 19. As described above, the lens 14 has a chromatic aberration that increases radially outward from the optical axis. Consequently, the portion of light incident on the peripheral portion of the lens surface on the object side of the lens 14 is dispersed by the chromatic aberration of the lens 14, passes through the second aperture 22, and is irradiated onto the second area 24 on the optical detection surface of the image sensor 13.

In this way, light that is dispersed by the chromatic aberration of the lens 14 is irradiated through the second aperture 22 onto the second area 24 as a beam of second light. Consequently, the second light is irradiated onto a different position on the optical detection surface in each wavelength band. In greater detail, the second light is irradiated onto a different position within the second area 24 on the optical detection surface in each wavelength band. In the second area 24 illustrated in FIG. 6, for example, an irradiation area 26 of light in a blue wavelength band, an irradiation area 27 of light in a green wavelength band, an irradiation area 28 of light in a red wavelength band, and an irradiation area 29 of light in the second infrared band C lie along a line from the center of the image circle 25 (or the center of the optical detection surface of the image sensor 13) radially outward.

The irradiation areas 26 to 29 may each partially overlap with another area, with the central position of each area not being included within another area, or the areas may be separated from each other. The irradiation position of each wavelength band of the second light on the optical detection surface of the image sensor 13 can be determined in advance by experiment or simulation. The pixels located near the central position of each of the irradiation areas 26 to 29 can therefore be determined in advance.

The imaging apparatus 10 detects the intensity of light in each wavelength band, among the light that passes through the imaging optical system 12, on the basis of the intensity of the second light that passes through the second aperture 22. Specifically, the imaging apparatus 10 detects the intensity of blue light, the intensity of green light, the intensity of red light, and the intensity of infrared light. Details of the process for detecting the intensity of light in each wavelength band are provided below. Detection of the intensity of light is also referred to below as calculation of the intensity of light.

Figure 7:
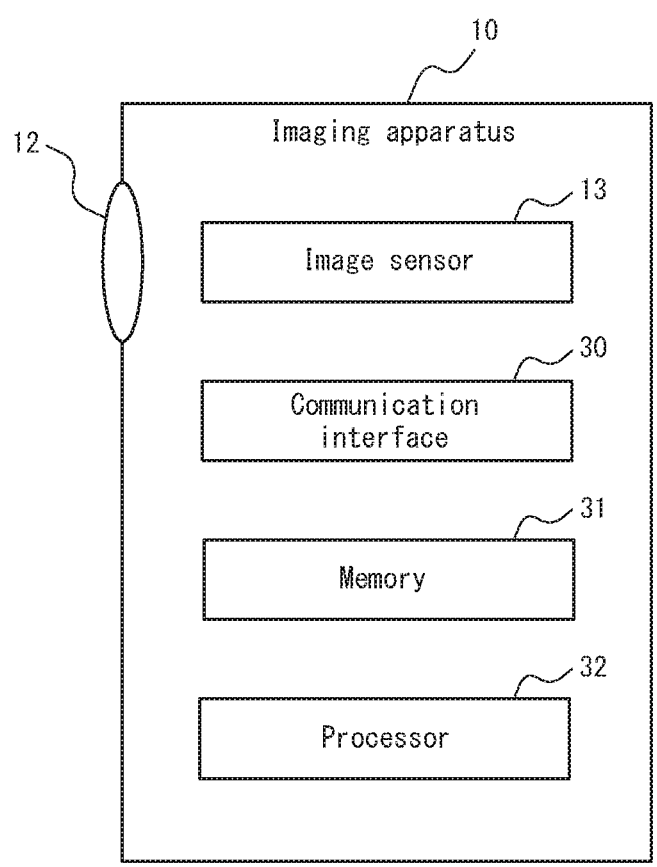
FIG. 7 is a block diagram illustrating the schematic configuration of the imaging apparatus.

The components of the imaging apparatus 10 are described with reference to FIG. 7. The imaging apparatus 10 includes the imaging optical system 12, the image sensor 13, a communication interface 30, a memory 31, and a processor 32.

The imaging optical system 12 includes a plurality of optical members, as described above. In the present embodiment, the imaging optical system 12 includes the four lenses 14 to 17, the filter 18, the mask 19, and the cover glass 20. The light passing through the imaging optical system 12 is irradiated onto the image sensor 13. Specifically, the first light that passes through the first aperture 21 and the second light that passes through the second aperture 22 of the mask 19 are irradiated onto the image sensor 13.

The image sensor 13 includes a charge coupled device (CCD) image sensor, a complementary metal-oxide semiconductor (CMOS) image sensor, or the like, for example. A plurality of pixels are arrayed on the optical detection surface of the image sensor 13, as described above. The image sensor 13 performs photoelectric conversion on the first light and the second light irradiated onto the optical detection surface. The image sensor 13 captures the image of the subject formed by the first light to generate a color captured image.

The communication interface 30 is an interface capable of communicating with external apparatuses over a network. The network may, for example, be wired or wireless or may include a controller area network (CAN) or the like installed in the vehicle 11.

The memory 31 includes a first memory device and a second memory device, for example. The memory 31 stores various information and programs necessary for operation of the imaging apparatus 10. The memory 31 stores the above-described information, for example, indicating the relationship between the wavelength of light and the sensitivity of pixels, as illustrated in FIG. 3. The memory 31 stores information, for example, related to the irradiation position of each wavelength band of the second light on the optical detection surface of the image sensor 13. Specifically, the memory 31 stores information indicating the pixels located near the central position of each of the irradiation areas 26 to 29 illustrated in FIG. 6.

Examples of the processor 32 include a dedicated processor such as a digital signal processor (DSP) and a general-purpose processor such as a central processing unit (CPU). The processor 32 controls overall operations of the imaging apparatus 10.

For example, the processor 32 controls operations of the image sensor 13 for the image sensor 13 to read the charge yielded by photoelectric conversion of the first light and the second light irradiated onto the optical detection surface and to generate a captured image that is based on the first light. The processor 32 may cause the image sensor 13 to read the charge and generate a captured image periodically, for example at 30 frames per second (FPS).

The processor 32 performs predetermined image processing on the captured images generated by the image sensor 13. The predetermined image processing may, for example, include white balance adjustment, exposure adjustment, gamma correction, trimming, object recognition processing, viewpoint conversion, and the like.

The predetermined image processing may be performed on the captured image of the current frame and may be performed on the captured image of the next or subsequent frame. For example, the processor 32 may perform white balance adjustment by adjusting the white balance of the captured image in the current frame using a white balance adjustment parameter calculated in the current frame, as described below. The processor 32 may also adjust the white balance setting when causing the captured image of the next or subsequent frame to be generated. Details of the operations of the imaging apparatus 10 during execution of the white balance adjustment are provided below.

The processor 32 may output the captured image subjected to predetermined image processing to external apparatuses. The external apparatuses may, for example, include a display or electronic control unit (ECU) provided in the vehicle 11.

Figure 8:
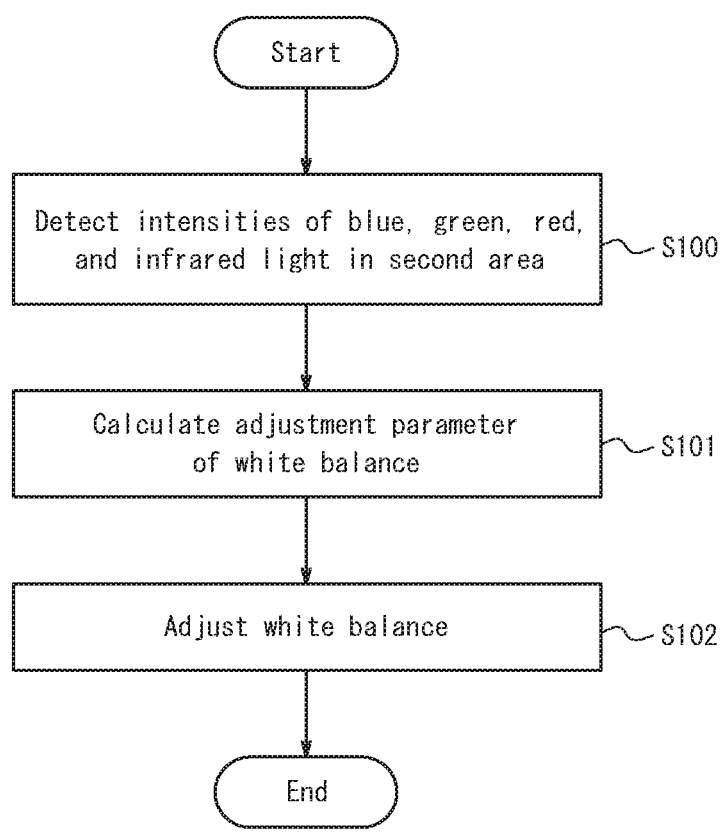
FIG. 8 is a flowchart illustrating operations of the imaging apparatus.

Details of the operations of the imaging apparatus 10 during execution of the white balance adjustment are described with reference to FIG. 8. These operations are executed every frame, for example.

Step S100: the processor 32 detects the intensity of light in each wavelength band in one or more second areas 24. In the present embodiment, the processor 32 detects the intensity of blue light, the intensity of the green light, the intensity of red light, and the intensity of infrared light.

Figure 6:
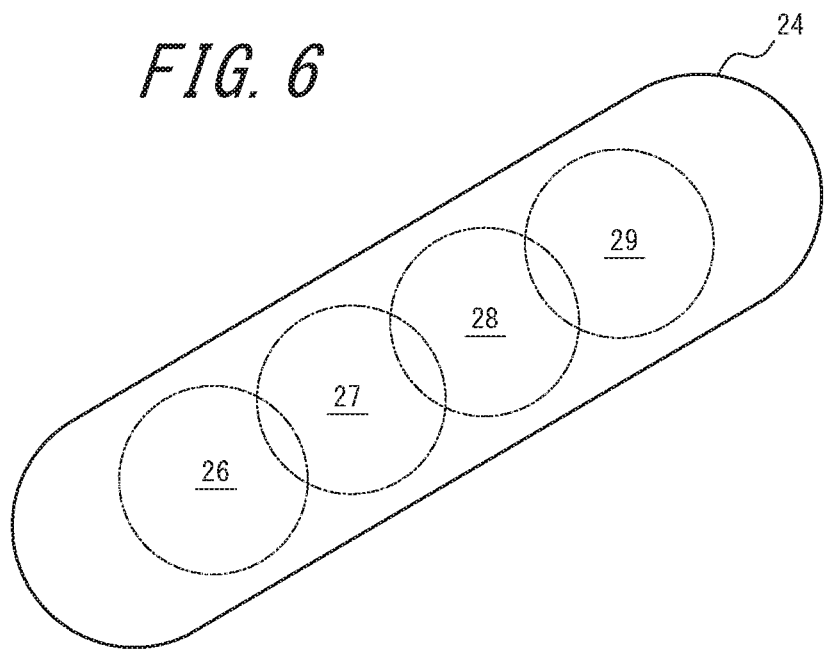
FIG. 6 is an enlarged view of the principal portion of FIG. 5.

Specifically, the processor 32 detects the intensity of blue light, among the light that passes through the imaging optical system 12, in the second area 24 illustrated in FIG. 6, for example. The intensity of blue light is detected on the basis of the RGB signal intensities from the pixels located near the central position of the irradiation area 26 of light in the blue wavelength band and the information, stored in the memory 31, indicating the relationship between the wavelength of light and the sensitivity of pixels. The processor 32 detects the intensity of green light, the intensity of red light, and the intensity of infrared light among the light that passes through the imaging optical system 12. The intensity of each type of light is detected on the basis of the RGB signal intensities from the pixels located near the central position of the irradiation areas 27, 28, and 29 and the above-described information indicating the relationship between the wavelength of light and the sensitivity of pixels.

In the case of a plurality of second areas 24, the processor 32 may determine that the average, for each wavelength band, of the intensity of light calculated for each of the plurality of second areas 24 is the intensity of light for that wavelength band.

When judging that the intensity of light calculated for at least one of the second areas 24 is an abnormal value, the processor 32 may exclude the intensity of light judged to be abnormal and determine that the average, for each wavelength band, of the intensity of light calculated for each of the remaining second areas 24 is the intensity of light for that wavelength band. For example, when a predetermined number of intensities are substantially equal and the remaining intensities are not substantially equal among n blue light intensities calculated for n second areas 24 (where 2≤n), the processor 32 may judge that the remaining intensities are abnormal values. The predetermined number may, for example, be 0.5 n or greater. The algorithm for judging a value to be abnormal is not limited to the above example, and any algorithm may be used.

Step S101: the processor 32 calculates an adjustment parameter for white balance adjustment on the basis of the intensity of light in each wavelength band detected in step S100. Specifically, when the intensity of infrared light is m times (where 1<m) or greater than the intensity of at least one of blue light, green light, and red light, for example, the processor 32 calculates the white balance adjustment parameter so as to reduce the effect of infrared light on the white balance of the captured image. Reduction of the effect of infrared light on the white balance of the captured image may, for example, include reducing the RGB signal component due to infrared light. The algorithm for calculating the adjustment parameter is not limited to the above example, and any algorithm may be used.

Step S102: the processor 32 adjusts the white balance using the adjustment parameter calculated in step S101.

Specifically, the processor 32 may perform white balance adjustment on the captured image of the current frame. The processor 32 may adjust the white balance setting when causing the captured image of the next or subsequent frame to be generated.

With a conventional technique, a photodiode and color transmission filters need to be provided. Adding components to the imaging apparatus may increase costs and increase the mounting area.

By contrast, the imaging apparatus 10 according to an embodiment of the present disclosure includes the mask 19 and the image sensor 13. The mask 19 includes the first aperture 21 and the second aperture 22. The image sensor 13 performs photoelectric conversion on the light that is irradiated onto the optical detection surface and passes through the first aperture 21 as first light and through the second aperture 22 as second light. This configuration allows the first light and the second light to be irradiated simultaneously onto the optical detection surface of the image sensor 13. As described above, the second light irradiated simultaneously with the first light is useful for reducing the effect of a change in the imaging conditions and adjusting the white balance. Hence, the imaging apparatus 10 can reduce the effect of a change in the imaging conditions and adjust the white balance without adding components such as a photodiode.

In the imaging apparatus 10, the light dispersed by the chromatic aberration of the lens 14, for example, is incident on the second aperture 22, and the second light is irradiated onto different positions on the optical detection surface in each wavelength band. This configuration allows light in the second infrared band C (infrared light) included in the second light to be separated from light in other wavelength bands and to be detected in the second area 24 on the optical detection surface irradiated by the second light, for example. As described above, detection of separated infrared light is useful for reducing the effect of infrared light on the white balance.

The present disclosure is based on the drawings and on embodiments, but it should be noted that a person of ordinary skill in the art could easily make a variety of modifications and adjustments on the basis of the present disclosure. Therefore, such changes and modifications are to be understood as included within the scope of the present disclosure. For example, the functions and the like included in the various means and steps may be reordered in any logically consistent way. Furthermore, means or steps may be combined into one or divided.

For example, a portion or all of the functions of the processor 32 in the imaging apparatus 10 may be implemented in another apparatus capable of communicating with the imaging apparatus 10.

In the above embodiment, the image sensor 13 has been described as including RGB pixels, but the pixels in the image sensor 13 are not limited to this configuration. For example, the pixels in the image sensor 13 may belong to a complementary color system.

In the above embodiment, the processor 32 of the imaging apparatus 10 has been described as detecting the intensity of blue light, the intensity of the green light, the intensity of red light, and the intensity of infrared light in one or more second areas 24. The method of detecting the intensity of light in each wavelength band is not, however, limited to this example. The processor 32 of the imaging apparatus 10 may, for example, be configured to be capable of detecting at least the intensity of infrared light in the second area 24.

Specifically, a bandpass filter that transmits only light in the second infrared band C could be provided on the second aperture 22 of the mask 19. In this configuration, only light in the second infrared band C is irradiated on the second area 24. This configuration may be used when, for example, the chromatic aberration of the imaging optical system 12 is relatively small, preventing sufficient separation of the light in each wavelength band in the second area 24. Details of the operations of the imaging apparatus 10 during execution of the white balance adjustment with this configuration are described with reference to FIG. 9. These operations are executed every frame, for example.

Step S200: the processor 32 detects the intensity of infrared light in one or more second areas 24.

Step S201: the processor 32 detects the intensity of light in each wavelength band in the first area 23. The intensity of light in each wavelength band may, for example, include the intensity of blue light, the intensity of green light, and the intensity of red light. Specifically, the processor 32 calculates an RGB histogram of the captured image generated on the basis of the first light irradiated on the first area 23, for example. Using the calculated RGB histogram, the processor 32 detects the intensity of blue light, the intensity of green light, and the intensity of red light. The algorithm executed by the processor 32 is not limited to the above example, and any algorithm for detecting the intensity of light in each wavelength band in the first area 23 may be used.

Step S202: the processor 32 calculates an adjustment parameter for white balance adjustment on the basis of the intensity of infrared light detected in step S200 and the intensity of light in each wavelength band detected in step S201.

Step S203: the processor 32 adjusts the white balance using the adjustment parameter calculated in step S202. Specifically, the processor 32 may perform white balance adjustment on the captured image of the current frame. The processor 32 may adjust the white balance setting when causing the captured image of the next or subsequent frame (for example, the next frame) to be generated.

Like the above embodiment, the imaging apparatus 10 with this configuration can also reduce the effect of a change in the imaging conditions and adjust the white balance without adding components such as a photodiode.

The components of the imaging apparatus 10 according to the above embodiment may be implemented as a communication device with a camera function, such as a mobile phone or a smartphone, and may be connected to the vehicle 11 by a wired or wireless connection.

The invention claimed is:

1. An imaging apparatus comprising:
    a lens;
    a mask comprising a first aperture and a second aperture, light passing through the lens being incident on the first aperture and the second aperture; and
    an image sensor configured to perform photoelectric conversion on first light that passes through the first aperture and on second light that passes through the second aperture, the first light and the second light being irradiated on an optical detection surface of the image sensor, wherein
    light dispersed by chromatic aberration of the lens is incident on the second aperture; and
    the second light is irradiated onto a different position on the optical detection surface in each wavelength band.

2. The imaging apparatus of claim 1, wherein a first area of the optical detection surface irradiated by the first light and a second area of the optical detection surface irradiated by the second light are separated from each other.

3. The imaging apparatus of claim 1, further comprising a processor configured to adjust a white balance on the basis of an intensity of the second light that passes through the second aperture.

4. The imaging apparatus of claim 3, wherein
    the mask comprises one or more of the second apertures;
    each of one or more beams of the second light is irradiated on one of four corners of the optical detection surface; and
    the processor is configured to adjust the white balance on the basis of an intensity of the one or more beams of the second light that each pass through the one or more of the second apertures.

5. The imaging apparatus of claim 3, wherein the processor is configured to adjust the white balance on the basis of a comparison, within the second light, between an intensity of light in an infrared band and an intensity of light in a wavelength band other than the infrared band.

6. An on-vehicle camera comprising:
    a lens;
    a mask comprising a first aperture and a second aperture, light passing through the lens being incident on the first aperture and the second aperture; and
    an image sensor configured to perform photoelectric conversion on first light that passes through the first aperture and on second light that passes through the second aperture, the first light and the second light being irradiated on an optical detection surface of the image sensor, wherein
    light dispersed by chromatic aberration of the lens is incident on the second aperture; and
    the second light is irradiated onto a different position on the optical detection surface in each wavelength band.

7. An image processing method using an imaging apparatus,
    the imaging apparatus comprising:
        a lens;
        a mask comprising a first aperture and a second aperture, light passing through the lens being incident on the first aperture and the second aperture;
        an image sensor configured to perform photoelectric conversion on first light that passes through the first aperture and on second light that passes through the second aperture, the first light and the second light being irradiated on an optical detection surface of the image sensor; and
        a processor,
    the image processing method comprising:
        calculating an intensity of the second light using the processor; and
        adjusting a white balance, using the processor, on the basis of the calculated intensity.

8. An imaging apparatus comprising:
    a lens;
    a mask comprising a first aperture and a second aperture, light passing through the lens being incident on the first aperture and the second aperture;
    an image sensor configured to perform photoelectric conversion on first light that passes through the first aperture and on second light that passes through the second aperture, the first light and the second light being irradiated on an optical detection surface of the image sensor; and a processor configured to adjust a white balance on the basis of an intensity of the second light that passes through the second aperture.

9. The imaging apparatus of claim 8, wherein a first area of the optical detection surface irradiated by the first light and a second area of the optical detection surface irradiated by the second light are separated from each other.

10. The imaging apparatus of claim 8, wherein
the mask comprises one or more of the second apertures;
each of one or more beams of the second light is irradiated on one of four corners of the optical detection surface; and
the processor is configured to adjust the white balance on the basis of an intensity of the one or more beams of the second light that each pass through the one or more of the second apertures.

11. The imaging apparatus of claim 8, wherein the processor is configured to adjust the white balance on the basis of a comparison, within the second light, between an intensity of light in an infrared band and an intensity of light in a wavelength band other than the infrared band.

\* \* \* \* \*